United States Patent [19]

Lee

[11] Patent Number: 4,879,017
[45] Date of Patent: Nov. 7, 1989

[54] MULTI-ROD TYPE MAGNETRON SPUTTERING APPARATUS

[75] Inventor: Hee-Yong Lee, Kyungki, Rep. of Korea

[73] Assignee: Dae Ryung Vacumm Co. Ltd., Seoul, Rep. of Korea

[21] Appl. No.: 279,200

[22] Filed: Nov. 29, 1988

[51] Int. Cl.⁴ ............................................. C23C 14/34
[52] U.S. Cl. ................................. 204/298; 204/192.12
[58] Field of Search ......... 204/192.1, 192.12, 298 TS, 204/298 ME, 298 SG, 298 PM, 298 CM

[56] References Cited

U.S. PATENT DOCUMENTS

| | | | |
|---|---|---|---|
| 3,649,502 | 3/1972 | Herte et al. | 204/298 TS X |
| 3,829,373 | 8/1974 | Kuehnle | 204/298 TS |
| 3,956,093 | 5/1976 | McLeod | 204/192.12 |
| 4,100,055 | 7/1978 | Rainey | 204/298 TS |
| 4,401,546 | 8/1983 | Nakamura et al. | 204/298 TS |
| 4,448,652 | 5/1984 | Pachonik | 204/298 TS |
| 4,569,745 | 2/1986 | Nagashima | 204/298 TS |

Primary Examiner—Nam X. Nguyen
Attorney, Agent, or Firm—Lieberman, Rudolph & Nowak

[57] ABSTRACT

A glow discharge magnetron sputtering apparatus having an improved multi-rod type target which produces a more uniform and higher rate of deposition on a substrate than obtainable in prior art devices, and which is particularly suitable for use in connection with the deposition of the magnetic materials. The apparatus includes a cathode comprising a cathode body, a backing plate connected removably with the cathode body, a copper-made common plate bonded to the bottom of the backing plate, and a target composed of a plurality of rods of material to be sputtered. Each rod has a sputtering surface of hemisphere form on the apex thereof.

4 Claims, 3 Drawing Sheets

FIG. 2
FIG. 3
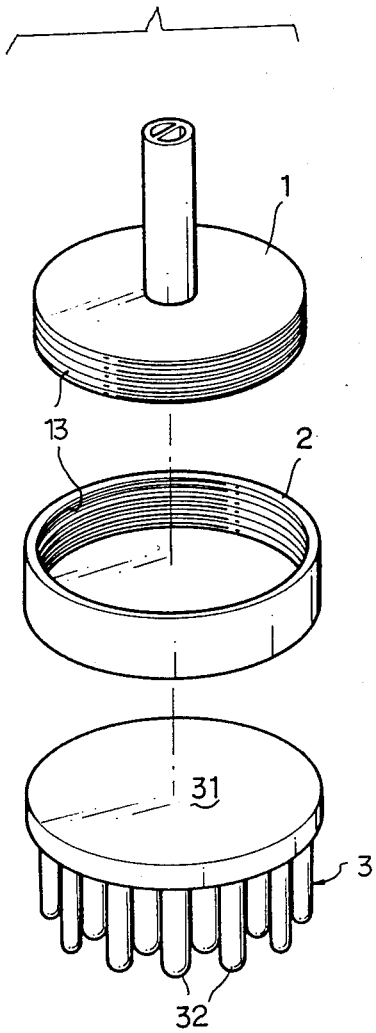
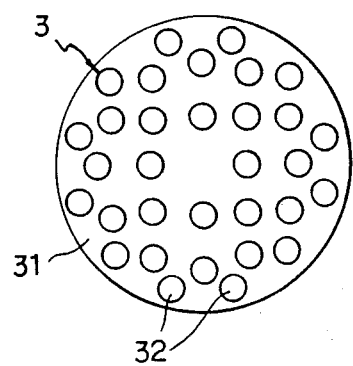

MULTI-ROD TYPE MAGNETRON SPUTTERING APPARATUS

TECHNICAL FIELD

The present invention relates to a magnetron sputtering apparatus for coating a substrate and, more particularly, to a magnetron sputtering apparatus having an improved target configuration producing a higher rate of deposition of the sputtered material on a substrate than obtainable in prior art devices.

BACKGROUND OF THE INVENTION

The technique of magnetron sputtering in order to produce a deposit on a substrate is well known. According to the simple principle of magnetron sputtering, a magnetic field is perpendicularly crossed with an electric field so as to cause a cycloidal motion of electrons adjacent to a target. This motion of electrons serves to prolong the mean free paths of electrons, thereby resulting in an increase in the chance to ionize argon gas particles thereby causing the confining of dense plasma adjacent to the target. Such plasma conditions facilitate the sputtering of target material.

Magnetron sputtering apparatus for producing a deposit on a substrate has made progress in various target configurations. However, most target configurations of these prior art devices seem to be suitable for high rate deposition of various materials to be sputtered, but not so efficient for the deposition of magnetic materials.

It is an object of the present invention to provide an improved sputtering apparatus having a multi-rod type target in which the magnetic flux lines can easily pass through the apex region of each rod without any hindrances, so as to obtain a highly uniform deposit.

Another object of the invention is to provide a magnetron sputtering apparatus suitable for use in connection with the deposition of magnetic materials although the apparatus is also useable for the deposition of various metals.

In the prior art target configurations of magnetron sputtering apparatus for use in connection with the deposition of magnetic materials, there are several drawbacks:

In the case of a single rod type target such as the one of Temescal Co. as illustrated in FIG. 5, a protrusion may be produced in the central part of the apex area of the rod as the sputtering proceeds, and a partial absorption of magnetic flux lines may occur at the apex region of the rod. In FIG. 5, the rod type target 112 is attached to the cathode body 110 which also functions as a backing plate. The anode 115 is positioned adjacent to the target. The transverse magnetic fields are produced by the electromagnets 114 which are positioned adjacent to the chamber 113.

As for the multi-slit type planar target of ULVAC CO. (so called G.T. Target) as illustrated in FIG. 4, the magnetic flux lines which are passing through the slits may be fairly decreased by the obstruction of the target pieces made of a magnetic material. In FIG. 4, the planar type target 104 made of a magnetic material having many slits is positioned on the backing plate 103. A yoke 102 with three permanent magnets is attached to the cathode body 101, and the upper side of the magnets is covered by the backing plate.

The merits of the multi-rod type target of the present invention can be discussed from the following technical points of view. It has been well known that the sputtering rate tends to be increased by oblique incidence of positive heavy-ions as opposed to their normal incidence against the target plane. The sputtering surface of a rod lies on the hemispherical shape of its apex including a slight length of adjacent rod side surface, because the magnetic field passes through this apex region. The configuration of this region of the rod seems to be suited for the oblique incidence of argon ions in comparison with a plane target case.

It is well known that when a sputtering surface is increased, the back diffusion of the sputtered particles can also be increased. Such back diffusion effect is detrimental for the formation of good sputtered film. When the surface area of an apex region is developed into a circular plane area, the size of this developed area can be compared with the whole front area of the backing plate. Accordingly a suitable number of rods can be chosen under the condition that the total of each developed area is equal to the whole front area of the common plate. It has been reported that the effect of back diffusion is greatly suppressed in sputtering, if the glow discharge is maintained in argon gas pressure of $10^{-3}$ torr [J.C. Helmer and C.E. Wickersham, J.Vac. Sci. Technol. A4(3), 408 (1986)]. From this point of view, it is understand that if the glow discharge is maintained preferably in the above-mentioned gas pressure, the multi-rod type target with a suitable number of rods can be tolerated against the effect of back diffusion.

From early in the history of heavy-ion sputtering, two main sputtering theories, thermal and collisional, have been advocated by investigators from their independent standpoints. As time elapsed, it was gradually recognized that both theories are true for sputtering phenomena. It is thought by the present inventor that the former is dominant in the ion energy range of less than 1 keV and the latter becomes dominant in the ion energy range of higher than around 4 keV. Recently, magnetron sputtering devices based on the most advanced technique in this field have actively prevailed, and the highest sputtering rate can be obtained at the ion energy of 0.7 keV in such devices.

According to the present inventor's publication with regard to the temperature dependence in sputtering, it has been confirmed, by both theory and experiment, that the highest sputtering yield takes place when the target is at room temperature [H.Y. Lee, Radiation Effects Lott. 43,161 (1979)]. This experiment was done in the ion energy of 1 keV with a silver target. A similar result, due to the same kind of experiment, has been earlier reported [T.W. Snouse and M. Bader, Trans. 8th National Symp. Washington (1961) 1, Pergamon Press Inc., New York (1962), P.271]. This experiment was done in the ion energy range of 3 keV with a copper target. Two engineers of Varian Assoc. have also reported that the sputtering yield is inversely proportional to the target temperature [F. Kloss and H. Herte, SCP and Solid State Technol. 10,48(1967)]. The above-mentioned results are keenly related to the theory of thermal spike effect in thermal sputtering. It has been known that the target materials should be highly pure in sputtering. This may be due to the effect of thermal conductivity which is important in thermal sputtering. If the highest sputtering yield in magnetron sputtering at the ion energy of 0.7 keV is caused by the collisional mode, the purity of the target material should have no meaning.

Now, the above-mentioned results are to be referred to the present invention, where the results are recognizable. Since the configuration of the apex region of a rod is fitted for producing thermal spikes with a higher probability than the case of a plane target of a similar area, this effect may be another reason for having a higher sputtering rate in the multi-rod type target than other current targets.

SUMMARY OF THE INVENTION

The present invention resides in apparatus for coating a substrate by magnetron sputtering comprising electromagnets for producing transverse magnetic fields toward the target, a ring type anode positioned to produce an accelerating electric field adjacent to the target for producing a glow discharge plasma which is confined by the magnetic field at the apex regions, and connecting means for connecting electrodes to a source of electrical potential, said apparatus characterized by a cathode comprising a cathode body, a backing plate connected removably with the cathode body and surrounded by a grounded shield cylinder, a copper-made common plate bonded to the bottom of the backing plate by a conductive epoxy, and a multi-rod type target composed of a plurality of rods of material to be sputtered, each rod having a sputtering surface of hemisphere form on the apex thereof and being connected to, and directed downward from, the copper-made common plate.

In the preferred embodiment, the size of rod including the diameter and the length, and the number of rods are predetermined in accordance with sputtering conditions, and the rod is not installed in the central area of the copper-made common plate so as to avoid non-uniform target erosion. More particularly, the cathode body is connected with the backing plate by means of suitable screwed means. Also, an indium foil can be inserted between the bottom of the cathode and the inner side of the backing plate to insure the electrical and thermal contacts.

BRIEF DESCRIPTION OF THE DRAWINGS

The invention will become more readily apparent from the following description of a preferred embodiment thereof shown, by way of example only, in the accompanying drawings, wherein:

FIG. 2 is an exploded view showing the connecting relation among the cathode body, the backing plate and the common plate with the multi-rod type target;

FIG. 3 is a top view of the target having a plurality of rods attached on the common plate;

DETAILED DESCRIPTION OF THE INVENTION

Figure 1:
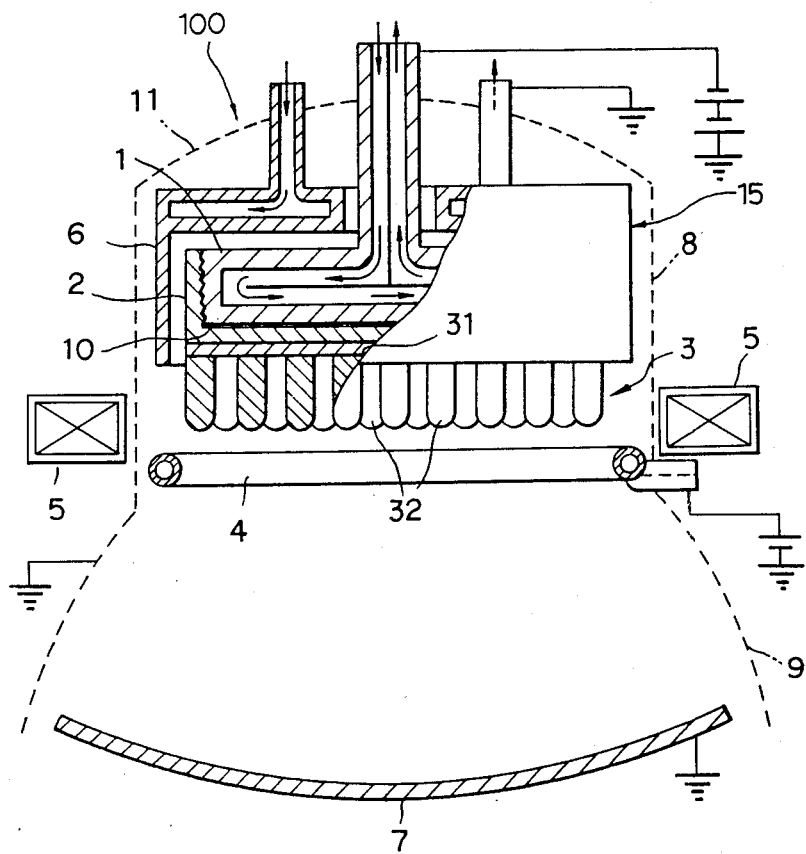
FIG. 1 is a schematic, cross-sectional view of the sputtering apparatus constructed in accordance with the present invention.
Figure 4:
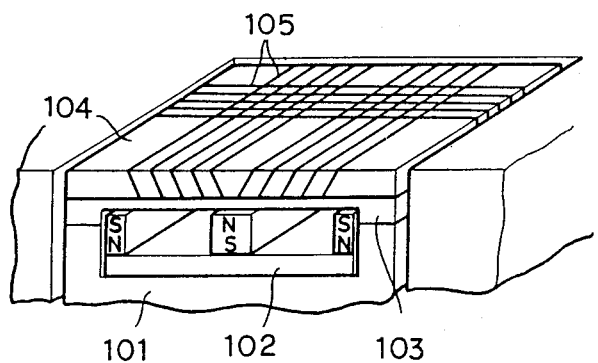
FIG. 4 is a schematic view of one magnetron sputtering apparatus of the prior art, having a multi-slit type planar target.
Figure 5:
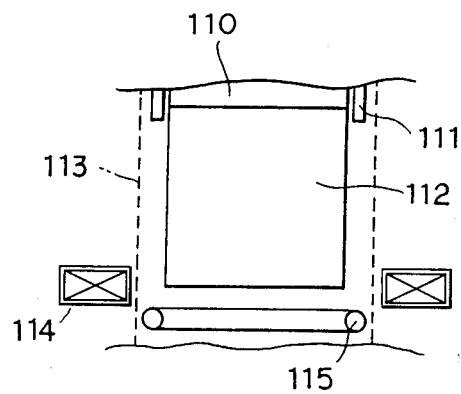
FIG. 5 is a schematic view of another magnetron sputtering apparatus of the prior art, having a single rod type target.

Referring now to the several drawings, and especially to FIG. 1, the magnetron sputtering apparatus 100 for coating a substrate according to the present invention includes a subchamber composed of a grounded stainless steel lid 11 and a fused quartz glass cylinder 8, and a grounded main chamber 9 made of suitable material such as stainless steel. The sealing between the fused quartz glass cylinder 8 and the grounded stainless steel lid 11 is accomplished by an Viton rubber gasket.

Disposed within the subchamber are a grounded shield cylinder 6 which is water-cooled at the upper side thereof, and a cathode 15. As best seen in FIG. 2, the cathode 15 comprises a cathode body 1, a backing plate 2 connected removably with the cathode body 1 and surrounded by the grounded shield cylinder 6 with a suitable gap, for example 6mm, and a copper-made common plate 31 attached on the front side of the backing plate 2 by using a conductive epoxy. The cathode body 1 is preferably connected with the backing plate 2 by means of suitable screwed means 13. An indium foil 10 is inserted between the bottom of the cathode body 1 and the inner side of the backing plate 2 to insure the electrical and thermal contacts, hence the backing plate 2 can be easily connected to, or separate from, the cathode body 1. In order to cool the cathode 15, a coolant such as a nonpolarizable liquid, kerosene, is circulated through the passage in the cathode body 1, as designated by the arrows in FIG. 1.

The cathode 15 further includes a target 3 composed of a plurality of rods 32 of material to be sputtered, each rod having a sputtered surface of hemispheric form on the apex thereof, so as to produce thermal spikes with a higher probability than the case of a plane target of similar area as aforementioned herein. Each of the rods 32 is screwed to, and directed downward from, the copper-made common plate 31. The common plate surface of the target side is reinforced by a sputtered film of tantalum, or tungsten so as to prevent it from easily sputtering.

The rods 32 are not installed in the central area of the copper-made common plate 31, so as to avoid non-uniform target erosion due to the transverse magnetic field created by four electromagnets, as will be described below. The size of rods 32 including the diameter and the length, and the number of rods 32 are predetermined in accordance with the sputtering conditions, for example, the heat conduction, the surface area of an apex region developed into a circular plane area, the discharge current, the balance of electrodes, etc.

The magnetron sputtering apparatus 100 of the present invention further includes four electromagnets 5 which are provided for producing the transverse magnetic fields toward the target, as known in the prior art. Four electromagnets 5 are connected on a ring-shaped yoke (not shown) with crossed directions by NS poles alternately. The magnetic fields produced by the electromagnets 5 have a weak in the central part where the intensity of the magnetic field is fairly low. Therefore, the rod 32 is not installed on the central area of the copper-made common plate 11, as seen in FIG. 3, so as to avoid non-uniform target erosion. The yoke can be gradually moved in an up and down direction to control the elevation of the magnetic fields in accordance with the erosion of the rod 32.

The magnetron sputtering apparatus 100 of the present invention also includes a ring type anode 4 positioned to produce an accelerating electric field adjacent to the target 3 for producing a glow discharge plasma which is confined by the magnetic field at the apex regions, as known in the prior art. The andode 4 comprises a copper tube having a relatively small cross section. The anode 4 is air-cooled at the outside of the chamber through a lead-in conductor.

The voltage to each of electrodes 4 and 15 is applied as follows. For example, when minus 600 volts are applied to the cathode against the anode through a breeder resistor, the point of +570 volts is grounded so that +30 volts is applied from the anode to ground potential.

The substrate holder plate 7 is positioned under the target 3 with the average spacing of around 60mm. The plate 7 is grounded or negatively biased.

From the foregoing, it can be seen that there has been provided an improved magnetron sputtering apparatus for coating a substrate in which the magnetic flux lines can easily pass through the apex region of each rod without hindrances. Particularly, the present invention provides an improved magnetron sputtering apparatus for coating a substrate which is able to obtain a highly uniform deposit. The present invention also provides an multi-rod type sputtering apparatus which is suitable for use in connection with the deposition of magnetic materials, because the common plate of non-magnetic material can not form the magnetic circuit.

It will be understood that the above description of the present invention is susceptible to various modifications, changes, and adaptations, and the same are intended to be comprehended within the meaning and range of equivalents of appended claims.

What is claimed is:

1. Apparatus for coating a substrate by magnetron sputtering comprising electromagnets for producing and directing transverse magnetic fields towards a target, an anode positioned to produce an accelerating electric field adjacent to the target, said anode also for producing a glow discharge plasma which is confined by the magnetic fields at predetermined apex regions, and connecting means for connecting electrodes to a source of electrical potential, said apparatus characterized by a cathode comprising a cathode body, a backing plate connected removably to the cathode body, a copper common plate secured to a bottom of said backing plate, and a multi-rod type target including a plurality of vertical rods of magnetic material to be sputtered, each rod having a sputtering surface of hemisperhic form on the apex thereof, and being connected to and directed downward from said copper common plate.

2. The apparatus according to claim 1 wherein the size of rod including the diameter and the length, and the number of rods are predetermined in accordance with sputtering conditions, and the rod is not installed in the central area of the copper-made common plate so as to avoid non-uniform target erosion.

3. The apparatus according to claim 1 wherein the cathode body is connected with the backing plate by screwed means.

4. The apparatus according to claims 1 or 3, wherein a plurality of indium foils having non-conductive paste within each foil are inserted between a bottom of the cathode body and an inner side of the backing plate to insure electrical and thermal contact.

* * * * *